US007639100B2

(12) United States Patent
Fuentes

(10) Patent No.: US 7,639,100 B2
(45) Date of Patent: Dec. 29, 2009

(54) RF STEP ATTENUATOR

(75) Inventor: Carlos Fuentes, Santa Clara, CA (US)

(73) Assignee: Giga-tronics, Inc, San Ramon, CA (US)

(*) Notice: Subject to any disclaimer, the term of this patent is extended or adjusted under 35 U.S.C. 154(b) by 100 days.

(21) Appl. No.: 11/929,987

(22) Filed: Oct. 30, 2007

(65) Prior Publication Data

US 2009/0108965 A1 Apr. 30, 2009

(51) Int. Cl.
*H01P 1/22* (2006.01)
*H01P 1/10* (2006.01)
*H03H 7/24* (2006.01)

(52) U.S. Cl. .................... 333/81 R; 333/103; 333/258; 333/262

(58) Field of Classification Search .............. 333/81 A, 333/81 R, 103, 258, 262; 327/308, 309; 323/354
See application file for complete search history.

(56) References Cited

U.S. PATENT DOCUMENTS 3,346,805 A * 10/1967 Hekimian .................. 323/224
5,347,239 A * 9/1994 Loehner et al. .......... 333/81 R

* cited by examiner

*Primary Examiner*—Stephen E Jones
(74) *Attorney, Agent, or Firm*—Jessica Costa

(57) ABSTRACT

A broadband, high-speed RF step attenuator implemented using long-lifetime PIN diode switches is presented which provides step attenuation across a significant portion of the entire RF frequency spectrum while maintaining minimal insertion loss, return loss, and harmonics.

19 Claims, 4 Drawing Sheets

RF STEP ATTENUATOR

The present invention relates generally to radio-frequency (RF) attenuators, and more particularly to a high-speed RF step attenuator implemented using long-lifetime PIN diode switches which provides step attenuation across the entire RF frequency spectrum while maintaining minimal insertion loss, return loss, and harmonics.

Electronic signal step attenuators are used in a variety of electronic applications to reduce the power level of an electronic signal for use by other electronic components or instruments requiring lower power signals. Step attenuators rely on switches to selectably couple one or more attenuator pads (also known as "sections") into the circuit.

In RF attenuators, the switches are generally activated by control signals which may be toggled by a computer or other control device. Among the switches commonly used in step attenuators are electromechanical RF relays, FET switches, and PIN diode switches.

Electromechanical relays afford the advantages of high power handling capability, DC coupling, low insertion loss, and isolation of the control signal from the signal being switched. However, mechanical attenuators comprise mechanical parts which wear out over time, and are often unreliable due to environmental noise, such as vibration.

FET devices, with the RF signal traversing the drain-source channel, can be switched by biasing the gate for an open or pinched-off channel. FET devices have the potential drawbacks of characteristically high insertion loss and non-linearity, particularly at the lower end of the RF frequency spectrum.

P-I-N, or simply "PIN", diodes can also be used as switching devices. PIN diodes differ from traditional PN junction diodes in that PIN diodes comprise an intrinsic semiconductor such as silicon between the P and N junctions of the diode. PIN diodes operate differently depending on the thickness of the intrinsic semiconductor separating the P and N junctions. When a PIN diode is manufactured with a thin intrinsic semiconductor, the carriers have a short recombination carrier lifetime. The carrier lifetime (also called the "recombination lifetime") is defined as the average time it takes an excess minority carrier to recombine. Short lifetime PIN diodes tend to have relatively low insertion loss, but are non-linear at low frequencies. When a PIN diode is manufactured with a thicker intrinsic semiconductor, the carriers have a longer carrier recombination lifetime. Long lifetime PIN diodes, such as those traditionally used for continuously variable attenuators, generally have more insertion loss than typically found with either FET devices or short lifetime PIN diodes, but have a more linear characteristic at lower frequencies.

PIN diodes offer low cost, fast switching speed, and high reliability. The disadvantage to utilizing PIN diodes is their characteristically high insertion loss. Furthermore, when used as switches in attenuators, they are bandwidth limited and generate undesired harmonics.

RF signals may range in frequency from 9 kHz up to thousands of GHz. Because of the aforementioned limitations of the available switching devices, and because the RF spectrum is so broadband, there are many challenges in building a step attenuator that provides sufficient attenuation across the entire RF spectrum.

It would therefore be desirable to have available a broadband, high-attenuation, high-frequency-switching-speed RF step attenuator that is characterized by low insertion loss, low return loss, and minimal harmonics.

SUMMARY OF THE INVENTION

Embodiments of the invention include fully electronic high-speed switches characterized by low insertion loss and minimal harmonics, and a broadband, high attenuation step attenuator characterized by low insertion loss, low return loss, and minimal harmonics.

In one embodiment, a PIN diode switch having a switch input port and a switch output port, the switch configured to switch between a pass-through state connecting the switch input port to the switch output port and a high impedance state isolating the switch input port from the switch output port, comprises at least two series-connected long-lifetime PIN diodes each having an anode and a cathode, the respective anodes of the series-connected long-lifetime PIN diodes each connected to the switch input port and the respective cathodes of the series-connected long-lifetime PIN diodes each connected to the switch output port, at least two shunt-connected long-lifetime PIN diodes each having an anode and a cathode, the respective anodes of the shunt-connected long-lifetime PIN diodes connected to the respective cathodes of the series-connected PIN diodes and the respective cathodes of the shunt-connected long-lifetime PIN diodes connected to a circuit ground, and a control port configured to receive a control signal, control port connected to the respective cathodes of the series-connected long-lifetime PIN diodes and to the respective anodes of the shunt-connected long-lifetime PIN diodes.

In another embodiment, a PIN diode switch having a switch input port, a first switch output port, and a second switch output port, the switch programmable by way of a control signal and a complement control signal to connect the switch input port to one or the other of the first switch output port and the second switch output port, comprises a first set of at least two series-connected long-lifetime PIN diodes each having an anode and a cathode, the respective anodes of the first set of series-connected long-lifetime PIN diodes connected to the switch input port and the respective cathodes of the first set of series-connected long-lifetime PIN diodes connected to the first switch output port, a first set of at least two shunt-connected long-lifetime PIN diodes each having an anode and a cathode, the respective anodes of the first set of shunt-connected long-lifetime PIN diodes connected to the respective cathodes of the first set of series-connected PIN diodes and the respective cathodes of the first set of shunt-connected long-lifetime PIN diodes connected to a circuit ground, a second set of at least two series-connected long-lifetime PIN diodes each having an anode and a cathode, the respective anodes of the second set of series-connected long-lifetime PIN diodes connected to the switch input port and the respective cathodes of the second set of series-connected long-lifetime PIN diodes connected the second switch output port, a second set of at least two shunt-connected long-lifetime PIN diodes each having an anode and a cathode, the respective anodes of the second set of shunt-connected long-lifetime PIN diodes connected to the respective cathodes of the second set of series-connected PIN diodes and the respective cathodes of the second set of shunt-connected long-lifetime PIN diodes connected to the circuit ground, and the respective cathodes of the first set of series-connected long-lifetime PIN diodes and the respective anodes of the first set of shunt-connected long-lifetime PIN diodes connected for control by the control signal, and the respective cathodes of the second set of series-connected long-lifetime PIN diodes and the respective anodes of the second set of shunt-connected long-lifetime PIN diodes connected for control by the complement control signal.

In yet another embodiment, a PIN diode switch including a first switch input port, a second switch input port, and a switch output port, the switch programmable by way of a control signal and a complement control signal to connect one or the other of the first switch input port and the second switch input port to the switch output port, comprises a first set of at least two series-connected long-lifetime PIN diodes each having an anode and a cathode, the respective anodes of the first set of series-connected long-lifetime PIN diodes each connected to the first switch input port and the respective cathodes of the first set of series-connected long-lifetime PIN diodes connected to the switch output port, a first set of at least two shunt-connected long-lifetime PIN diodes each having an anode and a cathode, the respective anodes connected to the respective cathodes of the first set of series-connected PIN diodes and the respective cathodes connected to a circuit ground, a second set of at least two series-connected long-lifetime PIN diodes each having an anode and a cathode, the respective anodes each connected to the second switch input port and the respective cathodes connected to the switch output port, a second set of at least two shunt-connected long-lifetime PIN diodes each having an anode and a cathode, the respective anodes connected to the respective cathodes of the of the second set of series-connected PIN diodes and the respective cathodes connected to the circuit ground, and the respective cathodes of the first set of series-connected long-lifetime PIN diodes and the respective anodes of the first set of shunt-connected long-lifetime PIN diodes connected for control by the control signal, and the respective cathodes of the second set of series-connected long-lifetime PIN diodes and the respective anodes of the second set of shunt-connected long-lifetime PIN diodes connected for control by the complement control signal.

In yet another embodiment, an attenuation cell comprises a grounded coplanar waveguide, the coplanar waveguide comprising a ground, an input signal line, an output signal line, a first signal line path connectable between the input signal line and the output signal line, and a second signal line path connectable between the input signal line and the output signal line, the second signal line path having a higher attenuation than the first signal line path, at least one control port configured to provide a control signal and a complement of the control signal, a first set of at least two series-connected long-lifetime PIN diodes each having an anode and a cathode, the respective anodes of the first set of series-connected long-lifetime PIN diodes each connected to the signal line input and the respective cathodes of the first set of series-connected long-lifetime PIN diodes each connected to the first signal line path, a first set of at least two shunt-connected long-lifetime PIN diodes each having an anode and a cathode, the respective anodes of the first set of shunt-connected long-lifetime PIN diodes connected to the respective cathodes of the first set of series-connected long-lifetime PIN diodes and the respective cathodes of the first set of shunt-connected long-lifetime PIN diodes connected to the coplanar waveguide ground, a second set of at least two series-connected long-lifetime PIN diodes each having an anode and a cathode, the respective anodes of the second set of series-connected long-lifetime PIN diodes each connected to the signal line input and the respective cathodes of the second set of series-connected long-lifetime PIN diodes each connected the second signal line path, a second set of at least two shunt-connected long-lifetime PIN diodes an anode and a cathode, the respective anodes of the second set of shunt-connected long-lifetime PIN diodes connected to the respective cathodes of the second set of series-connected long-lifetime PIN diodes and the respective cathodes of the second set of shunt-connected long-lifetime PIN diodes connected to the coplanar waveguide ground, a third set of at least two series-connected long-lifetime PIN diodes each having an anode and a cathode, the respective anodes of the third set of series-connected long-lifetime PIN diodes each connected to the first signal line path and the respective cathodes of the third set of series-connected long-lifetime PIN diodes each connected to the output signal line, a third set of at least two shunt-connected long-lifetime PIN diodes an anode and a cathode, the respective anodes of the third set of shunt-connected long-lifetime PIN diodes connected to the respective cathodes of the third set of series-connected long-lifetime PIN diodes and the respective cathodes of the third set of shunt-connected long-lifetime PIN diodes connected to the coplanar waveguide ground, a fourth set of at least two series-connected long-lifetime PIN diodes an anode and a cathode, the respective anodes of the fourth set of series-connected long-lifetime PIN diodes each connected to the second signal line path and the respective cathodes of the fourth set of series-connected long-lifetime PIN diodes each connected to the output signal line, a fourth set of at least two shunt-connected long-lifetime PIN diodes an anode and a cathode, the respective anodes of the fourth set of shunt-connected long-lifetime PIN diodes connected to the respective cathodes of the fourth set of series-connected long-lifetime PIN diodes and the respective cathodes of the fourth set of shunt-connected long-lifetime PIN diodes connected to the coplanar waveguide ground, wherein each of the respective cathodes of the first set of series-connected long-lifetime PIN diodes, the respective anodes of the first set of shunt-connected long-lifetime PIN diodes, the respective cathodes of the third set of series-connected long-lifetime PIN diodes, and the respective anodes of the third set of shunt-connected long-lifetime PIN diodes are connected for control by the control signal, and wherein each of the respective cathodes of the second set of series-connected long-lifetime PIN diodes, the respective anodes of the second set of shunt-connected long-lifetime PIN diodes, the respective cathodes of the fourth set of series-connected long-lifetime PIN diodes, the respective anodes of the fourth set of shunt-connected long-lifetime PIN diodes are connected for control by the complement control signal.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

Embodiments of the invention include fully electronic high-speed switches characterized by low insertion loss and minimal harmonics, and a broadband, high attenuation step attenuator characterized by low insertion loss, low return loss, and minimal harmonics.

In an embodiment, the step attenuator meets the RF specifications listed in Table 1.

TABLE 1

| Parameter | Unit | Specification Limit |
|---|---|---|
| Frequency Range | | |
| Fmin | MHz | 4.0 |
| Fmax | GHz | 8.0 |
| Attenuation Range (in 10 dB steps) | dB | 110 |
| Attenuation Flatness (over any 100 MHz Bandwidth) | dB | ±0.25 |
| Maximum Input Power | dBm | 27 |
| Insertion Loss | | |
| 4 MHz | dB | 10.0 |
| 1 GHz | dB | 2.5 |
| 3 GHz | dB | 7.0 |
| 8 GHz | dB | 10.0 |
| Harmonics (10 dBm input) | dBc | −57 |
| Return Loss | dB | 20 |
| Switching Speed | □sec | 100 |

Figure 1:
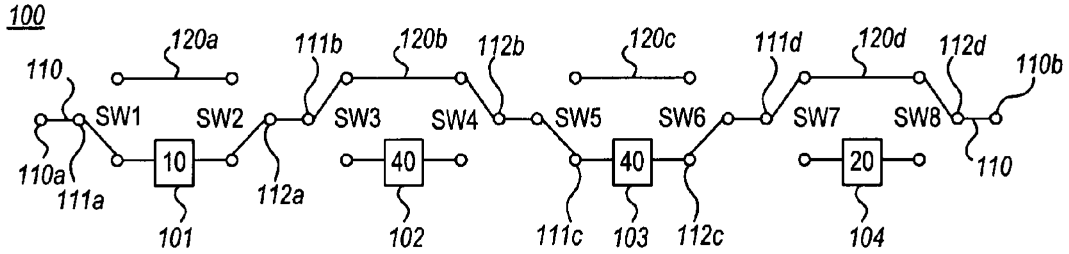
FIG. 1 is a schematic diagram of an exemplary embodiment of a "series" attenuator configuration which may be utilized in a step attenuator.

FIG. 1 illustrates a "series" attenuator configuration which may be utilized in a step attenuator 100 along a transmission line 110. As illustrated, the series attenuator configuration is characterized by a plurality of attenuator pads 101, 102, 103, 104, each of which can be serially interconnected in the circuit, or alternately bypassed, by a corresponding pair of single pole, double throw (SPDT) switches 111 and 112 (shown as 111*a*, 112*a*, 111*b*, 112*b*, 111*c*, 112*c*, 111*d*, 112*d*). As can be seen, a series step attenuator 100 with four attenuation pads (thereby defining 15 possible attenuation paths and a pass-through path) requires eight such switches. It will be noted that each pair of switches 111 and 112 must operate in coordination with each other in order to prevent an open circuit along the transmission line 110. (It will be recognized that four double-pole, double throw switches can alternatively be used. However, as used herein, "switches" are generally considered to mean single pole devices.)

As explained in the background section, one challenge in creating a broad bandwidth RF attenuator with acceptable electrical characteristics such as low insertion loss is balancing the tradeoff between reducing the series resistance of the attenuator switches 111 and 112 and introducing shunt capacitance. As also described in the background section, PIN diode switches tend to be of the short carrier recombination lifetime—that is, manufactured with a thin intrinsic semiconductor. The principal advantage of this type of switch is its lower insertion loss. However, as the frequency approaches the lower limits of the RF spectrum, the behavior of the PIN diode approaches that of a regular PN junction diode, which has the disadvantages of non-linearity and high insertion loss, because the carrier recombination lifetime (which is the reciprocal of the carrier frequency), is very short.

In contrast, although long lifetime PIN diodes generally introduce more insertion loss than typically found with either FET devices or short lifetime PIN diodes, long lifetime PIN diodes have less non-linearity at lower frequencies. In accordance with embodiments of the invention, at least two, and preferably exactly two, long-lifetime PIN diodes are connected in parallel with each other to maintain the flatter insertion loss characteristic at lower frequencies while lessening the series resistance (Rs). In an embodiment, the PIN diodes are implemented with MA4SPS552 PIN diodes, manufactured by M/A-COM Inc. and distributed by Tyco Electronics Corp., a Delaware corporation. The MA4SPS552 PIN diode has a minority carrier lifetime of 2.5 microseconds, a maximum total capacitance $C_T$ of 0.14 pF, and a series resistance of 2.4 Ohms or less. In addition, because PIN diodes are current controlled devices, it was found that the best compromise between maximizing current through each diode and minimizing insertion loss of the bias networks is in the current range of 25 to 35 mA.

Figure 2:
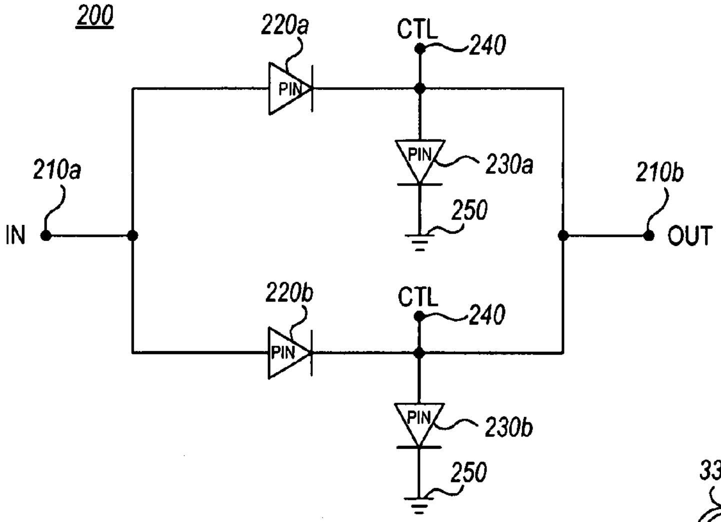
FIG. 2 is a schematic diagram of an exemplary embodiment of a series-shunt PIN diode switch.

In the "series" attenuator configuration of FIG. 1, each of the switches 111 and 112 are single-pole double-throw switches. Note that the switch 111 connects between the input of a given attenuation pad and one or the other of the pass-through path 120 (shown as 120*a*, 120*b*, 120*c*, 120*d*) and the attenuation path 130 (shown as 130*a*, 130*b*, 130*c*, 130*d*). Each switch 112 connects between the output of the given attenuation pad and one or the other of the pass-through path 120 and attenuation path 130. In embodiments of the invention, the building blocks of the single-pole double-throw switches 112, 112 are single-pole single-throw switches. Each single-pole, single-throw switch is implemented according to a series-shunt topology, as illustrated in FIG. 2. There are two reasons behind this. The first, and most important reason, is that the series-shunt topology provides more isolation in its "OFF" state than could be had with either series or shunt elements alone. The second reason is that impedance, particularly in the "OFF" state is better defined with the series-shunt topology. Each single-pole single-throw switch utilizes at least two PIN diodes connected in parallel with one another (but in series between the input and output ports of the switch) to lessen the series resistance, $R_S$, of both the series and shunt diode elements for the switch. Connection of multiple PIN diodes in parallel decreases the series resistance $R_S$, and thereby mitigates the issue with insertion loss of long lifetime PIN diodes. In the attenuator switches, the number of PIN diodes connected in parallel must be balanced against the additional diode capacitance, $C_T$, generated by each additional parallel PIN diode. That is, since capacitance is additive when diodes are connected in parallel, and capacitance limits the higher frequency performance for both insertion loss and return loss. In an embodiment, each switch comprises exactly two pin diodes connected in parallel Referring now to FIG. 2, in a preferred embodiment, there is shown a single-pole single-throw PIN diode switch 200. The switch 200 switches between a pass-through state and a high impedance state and is formed of two series-connected long-lifetime PIN diodes 220*a*, 220*b* and two shunt-connected long-lifetime PIN diodes 230*a*, 230*b*. The series-connected long-lifetime PIN diodes 220*a*, 220*b* are each connected in parallel with one another and in series between a switch input port and a switch output port. The two shunt-connected long-lifetime PIN diodes are shunted between the respective cathodes of the series PIN diodes and ground. The long lifetime PIN diodes 220*a*, 220*b*, 230*a*, 230*b* are selected to be characterized by very low capacitance, for example, less than 0.15 pF over the entire RF spectrum. A binary switching control signal 240, CTL, is applied via a control port to the junction between the respective cathodes of the series-connected diodes 220_a_, 220_b_ and the anodes of the shunt-connected diodes 230_a_, 230_b_ to drive the series-connected diodes 220_a_, 220_b_ and corresponding shunt-connected diodes 230_a_, 230_b_ into opposite states of conduction. In an embodiment, the current driven by the control signal 240, CTL, is in the current range of 25 to 35 mA.

In operation, when the binary control signal 240, CTL, is at a low level (e.g., −12 Volts, driving 25 mA of current per diode), the series-connected diodes 220_a_, 220_b_ switch ON and the shunt-connected diodes 230_a_, 230 switch OFF. Thus, the series-connected diodes 220_a_, 220_b_ conduct with a low resistance while the shunt-connected diodes 230_a_, 230 are non-conducting, thereby coupling an RF input signal, IN, received on input port 210_a_, to the output port with low loss. The conducting states of the series- and shunt-connected diodes are reversed when the binary control signal 240, CTL, is switched to a high level (e.g., 5 Volts, driving 25 mA of current per diode). The resistance of series-connected diodes 220_a_, 220_b_ increases significantly, while the shunt-connected diodes 230_a_, 230_b_ conduct with low resistance. Thus, the output port 210_b_ is highly isolated from the input signal, IN, on input port 210_a_.

Figure 3:
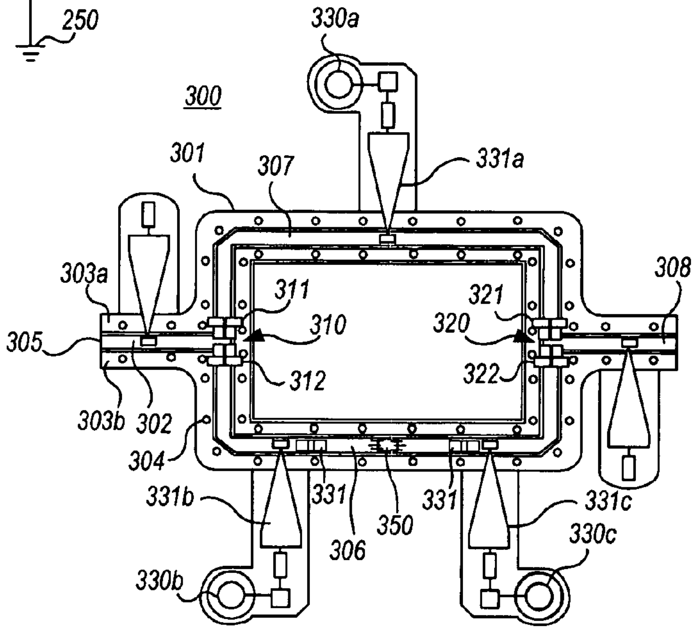
FIG. 3 is a circuit layout diagram of an exemplary embodiment of an RF attenuation pad "cell" of a grounded coplanar waveguide.

FIG. 3 is a circuit layout diagram of a single 10 dB attenuation cell 300, which is used as a building block in step attenuators implemented according to the invention. In an embodiment, the 10 dB attenuation pad 300 is implemented in a grounded coplanar waveguide 301. Although other transmission line media, such as microstrip transmission line media or non-grounded coplanar waveguide media, may be implemented, grounded coplanar waveguide was chosen as the transmission medium as a compromise between optimizing for series or shunt component placement. The grounded coplanar waveguide provides an ideal way to connect both the series and the shunt diodes. Other transmission line media, such as regular non-grounded coplanar waveguide, are less ideal for this application as they do not have simple means of connecting shunt devices—for example, in regular non-grounded coplanar waveguide, the ground is on the bottom surface of the substrate which is not accessible, except by means of radiating wires, to circuitry connected to the signal line on the top of the coplanar waveguide.

The grounded coplanar waveguide 301 comprises a signal line trace 302 sandwiched on both sides by grounded traces 303_a_, 303_b_. The grounded traces 303_a_, 303_b_ are connected by way of vias 304 to a ground layer (not shown). The transmission line path of the attenuation pad is divided into sections which include an input port 305, a high-attenuation path (e.g., rated at 10 dB) 306, a pass-through path 307, and an output port 308.

The signal line of the input port section 305 is connected to a first single-pole double-throw switch 310, and the signal line of the output port is connected to a second single-pole double-throw switch 320. Each of the single-pole double-throw switches 310, 320 are formed of two single-pole single-throw PIN diode switches such as shown in FIG. 2. In particular, the first single-pole double-throw switch connecting the input port 305 to one of either the pass-through path 307 or the high-attenuation path 306 comprises a first single-pole single-throw switch 311 having its input port connected to the signal line of the input port section 305 of the transmission line and its output port connected to the pass-through path 307 of the signal line. The first single-pole double-throw switch 310 also comprises a second single-pole single-throw switch 312 having its input port connected to the signal line of the input port section 305 of the transmission line and its output port connected to the high-attenuation path 306 of the signal line.

The second single-pole double-throw switch 320 comprises a first single-pole single-throw switch 321 having its input port connected to the pass-through path 307 of the signal line and its output port connected to the output port section 308 of the transmission line, and a second single-pole single-throw switch 322 having its input port connected to the high-attenuation path 306 of the signal line and its output port connected to the output port section 308.

The attenuation cell 300 includes a number of control ports 330_a_, 330_b_, and 330_c_, which control the states of the single-pole double-throw switches 310, 320. Each side of the cell 300 requires a control signal to insure that one path is connected between the input and output ports of the cell while the other path is isolated from the input 305 and output 308 ports of the cell 300. Furthermore, since the attenuator element 350 is a resistor network that will conduct DC current, each side of the attenuator element 350 must be DC blocked 331 to prevent burn-out of the resistors in the attenuator element 350. As a result, on the switch pair 312, 322 for the cell path with the attenuator chip(s) 350, two control terminals 330_b_, 330_c_ (DC blocked from each other) are implemented to enable the attenuation path 306.

Each of the control ports 330_a_, 330_b_, 330_c_ includes a conical inductor 331_a_, 331_b_, 331_c_ which prevents, over a very broad frequency range, RF energy from traversing the biasing networks. This is critical, as any energy leakage onto the bias network diverts available energy away from the load, and any energy leakage around the high attenuation elements will limit the amount of attenuation any given cell can provide. In an embodiment, the conical inductors 331_a_, 331_b_, 331_c_ are implemented with broadband conical inductors that handle a minimum of 100 mA of current and are characterized by a bandwidth extending from 10 MHz to 40 GHz with no resonances and flat across the full band. In an embodiment, the conical inductors 331_a_, 331_b_, 331_c_ are implemented using a Piconics CC110T47K240G5 broadband conical inductor, manufactured by Piconics, Inc., headquartered in Tyngsboro, Mass.

In operation, a binary switching control signal, CTL, is simultaneously applied to the control ports of the single-pole single-throw PIN diode switches 312, 322 connecting the input port 305 to, and output port 308 from, the high attenuation path 306. Likewise, the complement of the binary switching control signal, CTL', is simultaneously applied to the control ports of the single-pole single-throw PIN diode switches 311, 321 connecting the input port 305 to, and output port 308 from, the pass-through path 307.

That is, when the binary control current signal, CTL, is at a high level, the single-pole single-throw PIN diode switches 312, 322 connecting the input port 305 and output port 308 to the high attenuation path 306 switch on, thereby connecting the input 305 and output 306 ports to the high-attenuation path 306 to provide a 10 dB attenuation between the input and output ports. Simultaneously, the complement control signal, CTL', switches to at a low level, thereby turning off the single-pole single-throw PIN diode switches 311, 321 to isolate the input port 305 and output 308 port from the pass-through path 307 to cause all current to flow through the high-attenuation path 306.

Conversely, when the binary control signal, CTL, is at a low level (e.g., 0 Volts driving 0 Amps), the single-pole single-throw PIN diode switches 312, 322 connecting the input port and output port to the high attenuation path 306 switch off, thereby isolating the input 305 and output 308 ports from the high-attenuation path 306. Simultaneously, the complement control signal, CTL', is at a high level (e.g., 3.3 or 5 volts, driving 25 mA of current), thereby turning on the single-pole single-throw PIN diode switches 311, 321 to connect the input port 305 and output port 308 to the pass-through path 307 to provide a pass-through connection between the input and output ports.

Figure 4:
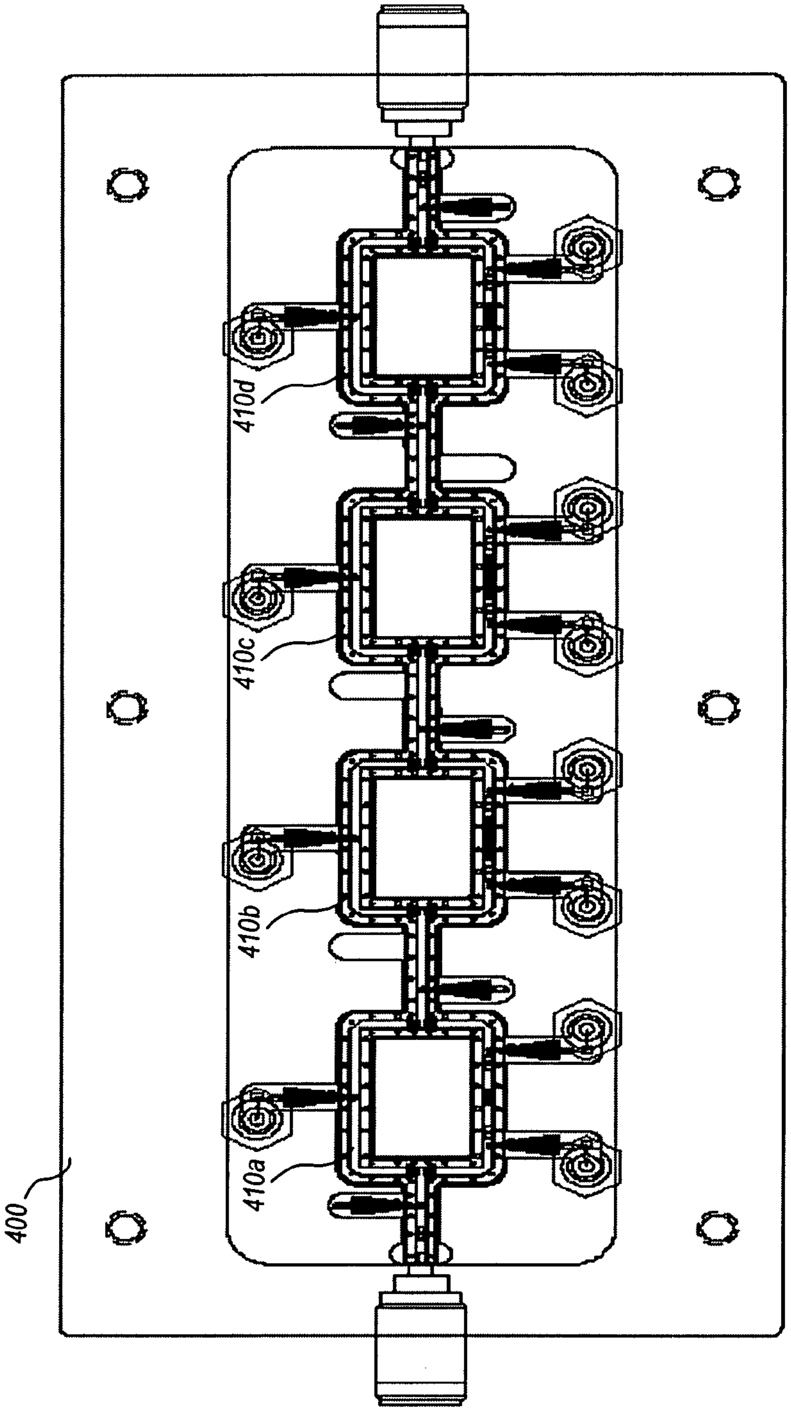
FIG. 4 is a circuit layout diagram of an exemplary embodiment of an RF step attenuator implemented on a grounded coplanar waveguide.

FIG. 4 illustrates a circuit layout diagram of a 110 dB grounded coplanar waveguide step attenuator 400 having a step size of 10 dB. The step attenuator 400 includes four attenuation cells 410 (shown as 410*a*, 410*b*, 410*c*, 410*d*) connected in series. Each cell 410 is identical except for the attenuation value of the attenuation path. In the embodiment shown, the first cell 410*a* includes a 10 dB attenuation path. In an embodiment, the 10 dB attenuation path is implemented with a 10 dB integrated circuit, for example a MCFC-T4010 10 dB chip T pad, manufactured by MicroMetrics, Inc., headquartered in Londonderry, N.H. The second cell 410*b* includes a 40 dB attenuation path. In an embodiment, the 40 dB attenuation path is implemented with four 10 dB integrated circuits connected in series. The third cell, 410*c*, is identical to the second cell, and the fourth cell, 410*d*, includes a 20 dB attenuation path, comprised of two 10 dB integrated circuits connected in series. In an embodiment, the 40 dB attenuation path is implemented with four 10 dB integrated circuits connected in series. In an alternative embodiment, the 40 dB attenuation path is implemented with a single 40 dB integrated circuit or two 20 dB integrated circuits.

Although in other embodiments the 20 and 40 dB attenuation paths may be implemented with a single 20 or 40 dB integrated circuit, it has been determined through analysis and measurement that a critical microwave parameter, Return Loss (or conversely Voltage Standing Wave Ration—VSWR), which defines how well an attenuator "attenuates" without creating reflections, may be adversely affected by using a single-chip higher-value attenuator design, rather than a plurality of lower-valued attenuator chips. One reason for this is the difficulty in physically fabricating the resistors necessary to make a very high value attenuator. Specifically, the geometry of the resistor patterns, particularly the shunt resistors, do not lend themselves to making an attenuator that will not generate reflections, and thus degrade the attenuator performance. Accordingly, in a preferred embodiment, the higher-value attenuation paths are implemented with a plurality of lower-value attenuation integrated circuits rather than a single higher-value attenuation integrated circuit.

It is to be understood that any number of attenuation cells 410 may be concatenated in a circuit, limited only by practical considerations such as step resolution and cost. It is also to be understood that the amount of attenuation provided by the attenuation circuit in each attenuation path of any given cell may be implemented using any desired attenuation value.

Each cell 410 further includes a single-pole double-throw switch connected between the cell input and each of the pass-through path and attenuation path, and a single-pole double-throw connected between the cell output and each of the pass-through path and attenuation path. Each of the single-pole double-throw switches are implemented with two single-pole single-throw switches as shown in, and described with respect to, FIGS. 2 and 3. The PIN diodes are all long-lifetime PIN diodes characterized by very low capacitance, for example, below at least 0.15 pF, across the entire RF spectrum. In an embodiment, the PIN diodes are implemented with MA4SPS552 PIN diodes, manufactured by M/A-COM Inc. and described previously. As also described previously, by selecting diodes with very low capacitance, it was found that the best compromise between reducing Rs and increasing CT was with two parallel diodes for both the series and shunt diode switch elements. Furthermore, since the PIN diodes are current controlled devices, it was found that the best compromise between maximizing current through each diode, and minimizing insertion loss of the bias networks was implementing the driving current of the control signal, CTL, in the current range of 25 to 35 mA when the control signal, CTL, is in the "on" state.

Figure 5:
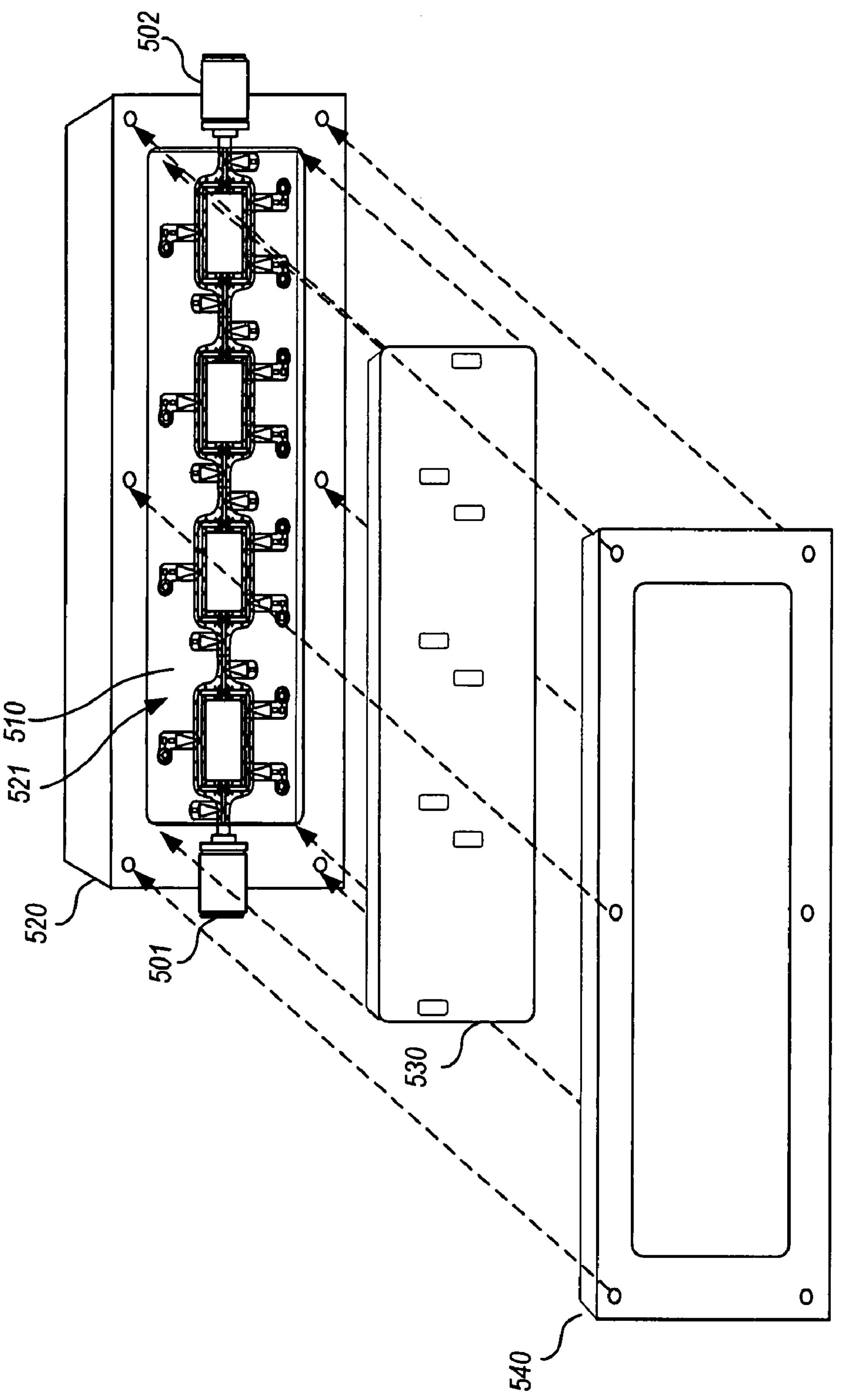
FIG. 5 is an exploded view of an exemplary embodiment of an RF step attenuator assembly.

FIG. 5 is an exploded view of an RF step attenuator assembly 500 implemented in accordance with an embodiment of the invention. As illustrated therein, when assembled, the RF step attenuator assembly 500 includes an attenuator circuit 510 implemented according to the circuit 400 of FIG. 4. The attenuator circuit 510 is implemented on a substrate protected by an enclosure 520. To assemble the attenuator, in one embodiment the circuit substrate, pre-printed with the grounded coplanar waveguide transmission line, is form-fitted to a cavity 521 in the enclosure 520 and then secured in place with conductive epoxy. An SMA connector 501 (male or female, according to the particular requirements of the RF step attenuator for the particular application in which it will be used) is connected to the enclosure 520 near the input of the grounded coplanar waveguide 510, and the center pin of the SMA connector 501 is soldered to the signal line trace of the transmission line on the substrate. Likewise, an SMA connector 502 (male or female) is connected to the enclosure 520 near the output of the grounded coplanar waveguide, and the center pin of the SMA connector 502 is soldered to the signal line of the grounded coplanar waveguide transmission line on the substrate.

The attenuator circuit components, including the chip attenuators, PIN diodes, inductors, capacitors, and resistors, are attached and electrically connected to appropriate contact points along the transmission line to form the attenuator circuit, as per FIG. 4. An RF absorber gasket 530 is then placed over the attenuator circuit 510, with a lid 540 sealing the gasket 530 and circuit 510 within the enclosure 520 to form the completed RF step attenuator assembly.

A number of design implementations enhance the ability to provide high degrees of electrical isolation. In one aspect, the physical transmission line media itself was given significant consideration. In a preferred embodiment, the substrate of the circuit 510 is a soft material such as Duroid®, or similar ceramic/glass impregnated Teflon® based substrate material, which provides more than 110 dB of isolation between the signal line and the assembly. According to another aspect, rather than using a relatively thin conductive gasket, a much thicker RF absorbing gasket 530 is preferably used to allow the RF channels to be made smaller, without causing a mechanical interference problem with new, much larger conical coils. According to another aspect, true RF filter feedthrus are preferably used, rather than the conventional capacitive-only feedthrus. According to yet another aspect, the lids over controller PCA is fabricated from cold rolled steel for superior isolation of radiated energy generated from the switching power supply. Per another aspect, the microcircuit body is preferably fabricated from aluminum, with a relatively thick silver plate coating. Finally, the silver plating is to help reduce conductivity losses that may adversely affect RF insertion loss.

Figure 6:
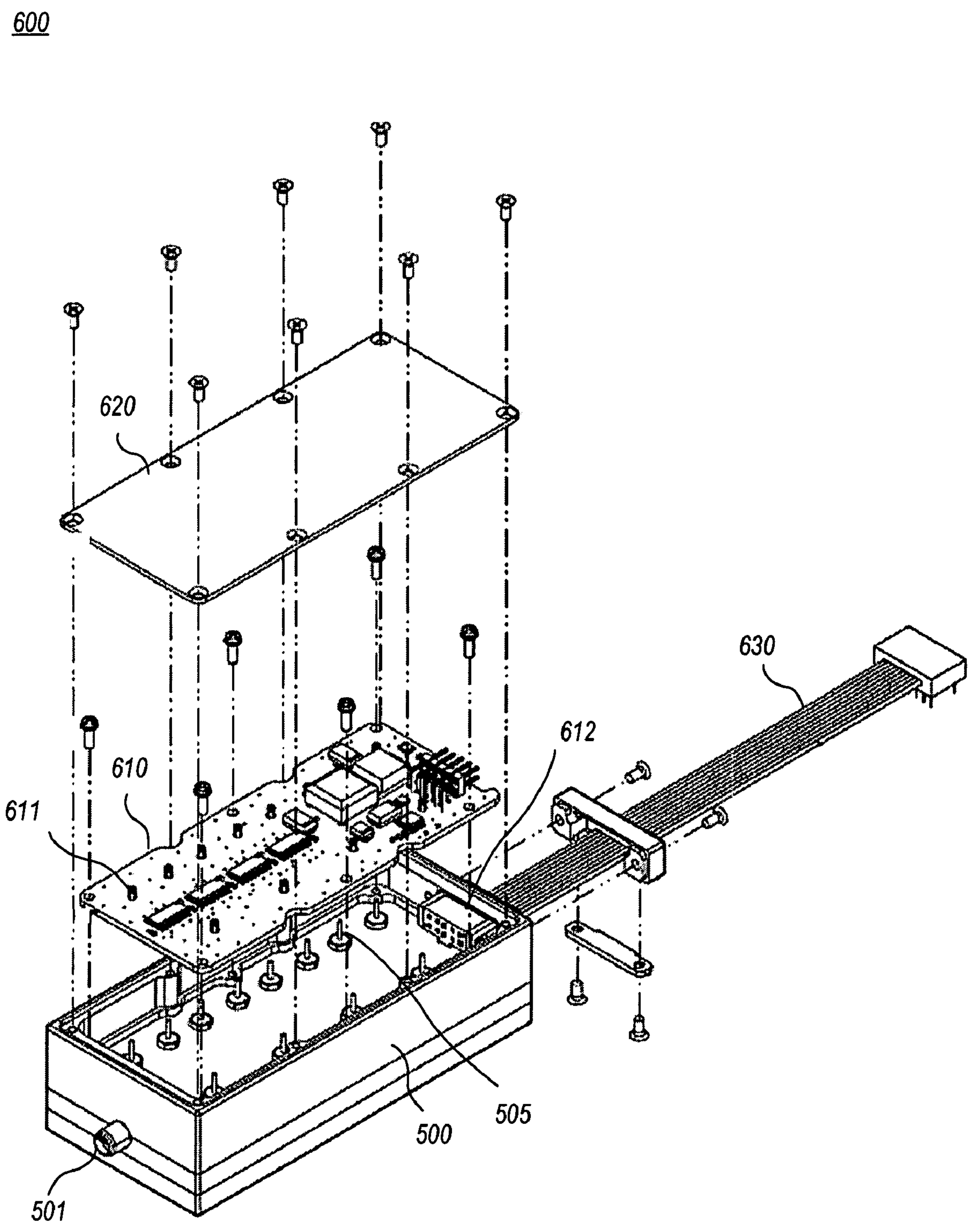
FIG. 6 is an exploded view of an exemplary embodiment of an RF step attenuator and controller assembly.

FIG. 6 is an exploded view of an RF step attenuator circuit assembly 600, including a controller printed circuit board (PCB) 610. The assembly 600 includes the step attenuator assembly 500 of FIG. 5, the controller PCB 610, and a lid 620. The controller PCB 610 includes connectors 611 which attach to control ports 505 on the bottom side of the substrate of the RF step attenuator circuit 510, and a ribbon cable connector 612 which attaches to a ribbon cable 630 for connection to another device (not shown). The PCB 610 includes logic voltage controlled current drivers 613 which generates the control signals (CTL and CTL') for controlling the PIN diode switches of the RF attenuator.

In summary, the RF step attenuator described herein provides broadband, high-speed step attenuation across a significant portion of the entire RF frequency spectrum, yet maintains minimal insertion loss, return loss, and harmonics.

Although this preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A PIN diode switch having a switch input port and a switch output port, the switch configured to switch between a pass-through state connecting the switch input port to the switch output port and a high impedance state isolating the switch input port from the switch output port, the switch comprising:

at least two series-connected PIN diodes each characterized by a long carrier-recombination lifetime and having an anode and a cathode, the respective anodes of the series-connected PIN diodes each connected to the switch input port and the respective cathodes of the series-connected PIN diodes each connected to the switch output port;

at least two shunt-connected PIN diodes each characterized by a long carrier-recombination lifetime and having an anode and a cathode, the respective anodes of the shunt-connected PIN diodes connected to the respective cathodes of the series-connected PIN diodes and the respective cathodes of the shunt-connected PIN diodes connected to a circuit ground; and a control port configured to receive a control signal, the control port connected to the respective cathodes of the series-connected PIN diodes and to the respective anodes of the shunt-connected PIN diodes, the control signal operating in either a first control signal state which places the at least two series-connected PIN diodes in a highly conductive state and the at least two shunt-connected PIN diodes in a non-conducting state to thereby conductively couple the switch input port to the switch output port, or a second control signal state which places the at least two series-connected PIN diodes in a non-conducting state and the at least two shunt-connected PIN diodes in a highly conductive state to thereby isolate the switch input port from the switch output port.

2. The switch of claim 1, wherein each of the series-connected PIN diodes and the shunt-connected PIN diodes are characterized by a capacitance of less than 0.15 pF across the entire RF frequency spectrum.

3. The switch of claim 1, wherein the switch input port is connected to a first section of a signal line of a transmission line and the switch output is connected to a second section of a signal line of the transmission line.

4. The PIN diode switch of claim 1, wherein the at least two series-connected PIN diodes comprises exactly two series-connected PIN diodes connected in parallel with one another and in series between the input port and the output port, and the at least two shunt-connected PIN diodes exactly two shunt-connected PIN diodes respectively connected between the respective cathodes of the series-connected PIN diodes and the circuit ground.

5. A PIN diode switch having a switch input port, a first switch output port, and a second switch output port, the switch programmable by way of a control signal and a complement control signal to connect the switch input port to one or the other of the first switch output port and the second switch output port, the switch comprising:

a first set of at least two series-connected long-lifetime PIN diodes each having an anode and a cathode, the respective anodes of the first set of series-connected long-lifetime PIN diodes connected to the switch input port and the respective cathodes of the first set of series-connected long-lifetime PIN diodes connected to the first switch output port;

a first set of at least two shunt-connected long-lifetime PIN diodes each having an anode and a cathode, the respective anodes of the first set of shunt-connected long-lifetime PIN diodes connected to the respective cathodes of the first set of series-connected PIN diodes and the respective cathodes of the first set of shunt-connected long-lifetime PIN diodes connected to a circuit ground;

a second set of at least two series-connected long-lifetime PIN diodes each having an anode and a cathode, the respective anodes of the second set of series-connected long-lifetime PIN diodes connected to the switch input port and the respective cathodes of the second set of series-connected long-lifetime PIN diodes connected the second switch output port;

a second set of at least two shunt-connected long-lifetime PIN diodes each having an anode and a cathode, the respective anodes of the second set of shunt-connected long-lifetime PIN diodes connected to the respective cathodes of the second set of series-connected PIN diodes and the respective cathodes of the second set of shunt-connected long-lifetime PIN diodes connected to the circuit ground; and the respective cathodes of the first set of series-connected long-lifetime PIN diodes and the respective anodes of the first set of shunt-connected long-lifetime PIN diodes connected for control by the control signal, and the respective cathodes of the second set of series-connected long-lifetime PIN diodes and the respective anodes of the second set of shunt-connected long-lifetime PIN diodes connected for control by the complement control signal.

6. The switch of claim 5, wherein each of the PIN diodes in the first and second set of series connected long lifetime PIN diodes and the first and second sets of shunt-connected long lifetime PIN diodes are characterized by a capacitance of less than 0.15 pF across the entire RE frequency spectrum.

7. The switch of claim 5, the switch input port connected to a grounded coplanar waveguide signal line, the first switch output port connected to a non-attenuated signal line path, and the second switch output port connected to an attenuated signal line path.

8. The PIN diode switch of claim 5, wherein each set of the at least two series-connected PIN diodes comprises exactly two series-connected PIN diodes connected in parallel with one another and in series between the input port and the output port, and each set of the at least two shunt-connected PIN diodes exactly two shunt-connected PIN diodes respectively connected between the respective cathodes of the series-connected PIN diodes and the circuit ground.

9. A PIN diode switch having a first switch input port, a second switch input port, and a switch output port, the switch programmable by way of a control signal and a complement control signal to connect one or the other of the first switch input port and the second switch input port to the switch output port, the switch comprising:

a first set of at least two series-connected long-lifetime PIN diodes each having an anode and a cathode, the respective anodes of the first set of series-connected long-lifetime PIN diodes each connected to the first switch input port and the respective cathodes of the first set of series-connected long-lifetime PIN diodes connected to the switch output port;

a first set of at least two shunt-connected long-lifetime PIN diodes each having an anode and a cathode, the respective anodes connected to the respective cathodes of the first set of series-connected PIN diodes and the respective cathodes connected to a circuit ground;

a second set of at least two series-connected long-lifetime PIN diodes each having an anode and a cathode, the respective anodes each connected to the second switch input port and the respective cathodes connected to the switch output port;

a second set of at least two shunt-connected long-lifetime PIN diodes each having an anode and a cathode, the respective anodes connected to the respective cathodes of the of the second set of series-connected PIN diodes and the respective cathodes connected to the circuit ground; and the respective cathodes of the first set of series-connected long-lifetime PIN diodes and the respective anodes of the first set of shunt-connected long-lifetime PIN diodes connected for control by the control signal, and the respective cathodes of the second set of series-connected long-lifetime PIN diodes and the respective anodes of the second set of shunt-connected long-lifetime PIN diodes connected for control by the complement control signal.

10. The switch of claim 9, wherein each of the series connected long lifetime PIN diodes and the shunt-connected long lifetime PIN diodes are characterized by a capacitance of less than 0.15 pF across the entire RE frequency spectrum.

11. The switch of claim 9, the switch input port connected to a grounded coplanar waveguide signal line, the first switch output port connected to a non-attenuated signal line path, and the second switch output port connected to an attenuated signal line path.

12. The PIN diode switch of claim 9, wherein each set of the at least two series-connected PIN diodes comprises exactly two series-connected PIN diodes connected in parallel with one another and in series between the input port and the output port, and each set of the at least two shunt-connected PIN diodes exactly two shunt-connected PIN diodes respectively connected between the respective cathodes of the series-connected PIN diodes and the circuit ground.

13. An attenuation section, comprising:

a grounded coplanar waveguide, the coplanar waveguide comprising a ground, an input signal line, an output signal line, a first signal line path connectable between the input signal line and the output signal line, and a second signal line path connectable between the input signal line and the output signal line, the second signal line path having a higher attenuation than the first signal line path;

at least one control pod configured to provide a control signal and a complement of the control signal;

a first set of at least two series-connected long-lifetime PIN diodes each having an anode and a cathode, the respective anodes of the first set of series-connected long-lifetime PIN diodes each connected to the signal line input and the respective cathodes of the first set of series-connected long-lifetime PIN diodes each connected to the first signal line path;

a first set of at least two shunt-connected long-lifetime PIN diodes each having an anode and a cathode, the respective anodes of the first set of shunt-connected long-lifetime PIN diodes connected to the respective cathodes of the first set of series-connected long-lifetime PIN diodes and the respective cathodes of the first set of shunt-connected long-lifetime PIN diodes connected to the coplanar waveguide ground;

a second set of at least two series-connected long-lifetime PIN diodes each having an anode and a cathode, the respective anodes of the second set of series-connected long-lifetime PIN diodes each connected to the signal line input and the respective cathodes of the second set of series-connected long-lifetime PIN diodes each connected the second signal line path;

a second set of at least two shunt-connected long-lifetime PIN diodes an anode and a cathode, the respective anodes of the second set of shunt-connected long-lifetime PIN diodes connected to the respective cathodes of the second set of series-connected long-lifetime PIN diodes and the respective cathodes of the second set of shunt-connected long-lifetime PIN diodes connected to the coplanar waveguide ground;

a third set of at least two series-connected long-lifetime PIN diodes each having an anode and a cathode, the respective anodes of the third set of series-connected long-lifetime PIN diodes each connected to the first signal line path and the respective cathodes of the third set of series-connected long-lifetime PIN diodes each connected to the output signal line;

a third set of at least two shunt-connected long-lifetime PIN diodes an anode and a cathode, the respective anodes of the third set of shunt-connected long-lifetime PIN diodes connected to the respective cathodes of the third set of series-connected long-lifetime PIN diodes and the respective cathodes of the third set of shunt-connected long-lifetime PIN diodes connected to the coplanar waveguide ground;

a fourth set of at least two series-connected long-lifetime PIN diodes an anode and a cathode, the respective anodes of the fourth set of series-connected long-lifetime PIN diodes each connected to the second signal line path and the respective cathodes of the fourth set of series-connected long-lifetime PIN diodes each connected to the output signal line;

a fourth set of at least two shunt-connected long-lifetime PIN diodes an anode and a cathode, the respective anodes of the fourth set of shunt-connected long-lifetime PIN diodes connected to the respective cathodes of the fourth set of series-connected long-lifetime PIN diodes and the respective cathodes of the fourth set of shunt-connected long-lifetime PIN diodes connected to the coplanar waveguide ground;

wherein each of the respective cathodes of the first set of series-connected long-lifetime PIN diodes, the respective anodes of the first set of shunt-connected long-lifetime PIN diodes, the respective cathodes of the third set of series-connected long-lifetime PIN diodes, and the respective anodes of the third set of shunt-connected long-lifetime PIN diodes are connected for control by the control signal; and wherein each of the respective cathodes of the second set of series-connected long-lifetime PIN diodes, the respective anodes of the second set of shunt-connected long-lifetime PIN diodes, the respective cathodes of the fourth set of series-connected long-lifetime PIN diodes, the respective anodes of the fourth set of shunt-connected long-lifetime PIN diodes are connected for control by the complement control signal.

14. The attenuation section of claim 13, wherein all of the PIN diodes are characterized by a capacitance of less than 0.15 pF across the entire RF frequency spectrum.

15. The attenuation section of claim 13, connected in series with at least one additional attenuation pad of claim 1 to form a step attenuator circuit.

16. The attenuation section of claim 13, wherein each set of the at least two series-connected PIN diodes comprises exactly two series-connected PIN diodes connected in parallel with one another and in series between the input port and the output port, and each set of the at least two shunt-connected PIN diodes exactly two shunt-connected PIN diodes respectively connected between the respective cathodes of the series-connected PIN diodes and the circuit ground.

17. The attenuation section of claim 13, wherein the transmission media comprises a grounded coplanar waveguide.

18. The attenuation section of claim 17, wherein the grounded coplanar waveguide is formed on a soft substrate material having a relative dielectric constant lower than at least 3.5.

19. The attenuation pad of claim 18, the substrate material comprising ceramic/glass impregnated substrate material.

* * * * *